United States Patent
Gamsa et al.

(10) Patent No.: US 8,813,018 B1
(45) Date of Patent: Aug. 19, 2014

(54) METHOD AND APPARATUS FOR AUTOMATICALLY CONFIGURING MEMORY SIZE

(71) Applicants: Benjamin Gamsa, Toronto (CA); Gordon Raymond Chiu, North York (CA)

(72) Inventors: Benjamin Gamsa, Toronto (CA); Gordon Raymond Chiu, North York (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/646,559

(22) Filed: Oct. 5, 2012

(51) Int. Cl.
*G06F 17/50* (2006.01)

(52) U.S. Cl.
USPC ........... 716/132; 716/101; 716/104; 716/116; 716/117

(58) Field of Classification Search
USPC ................... 716/100, 101, 104, 116, 117, 132
See application file for complete search history.

(56) References Cited

U.S. PATENT DOCUMENTS

| | | | | |
|---|---|---|---|---|
| 4,399,507 A * | 8/1983 | Cosgrove et al. | | 712/219 |
| 4,931,923 A * | 6/1990 | Fitch et al. | | 710/104 |
| 5,247,674 A | 9/1993 | Kogure | | |
| 5,535,368 A * | 7/1996 | Ho et al. | | 711/170 |
| 6,061,520 A | 5/2000 | Yellin et al. | | |
| 6,223,274 B1 * | 4/2001 | Catthoor et al. | | 712/34 |
| 6,522,167 B1 * | 2/2003 | Ansari et al. | | 326/39 |
| 6,634,017 B2 * | 10/2003 | Matsui et al. | | 716/102 |
| 6,662,285 B1 * | 12/2003 | Douglass et al. | | 711/167 |
| 6,788,104 B2 * | 9/2004 | Singh et al. | | 326/39 |
| 7,000,092 B2 * | 2/2006 | Gehman et al. | | 712/32 |
| 7,062,400 B2 * | 6/2006 | Uetani | | 702/117 |
| 7,653,736 B2 * | 1/2010 | Van Eijndhoven et al. | | 709/231 |
| 7,661,097 B2 | 2/2010 | Mukkavilli | | |
| 8,099,636 B2 | 1/2012 | Tilton et al. | | |
| 2008/0168460 A1 | 7/2008 | Lee et al. | | |
| 2011/0314249 A1 * | 12/2011 | Arnal | | 711/172 |
| 2012/0137291 A1 * | 5/2012 | Bacher et al. | | 718/1 |

OTHER PUBLICATIONS

Regehr et al., "Eliminating stack overflow by abstract interpretation", Proceedings of the 3rd International Conference on Embedded Software, Philadelphia, PA, Oct. 2003 (17 pages).

Agren, Static Code Analysis for Embedded Systems, Master of Science Thesis in Computer Science and Engineering, Chalmers University of Technology, Sweden, Aug. 2009 (34 pages).

Ferdinand et al., "Static memory and timing analysis of embedded systems code", AbsInt Angewandte Informatik GmbH, 2006 (11 pages).

Kienle et al., "System-specific static code analyses for complex embedded systems", Fourth International Workshop on Software Quality and Maintainability (SQM 2010), Madrid, Spain, 2010 (9 pages).

* cited by examiner

*Primary Examiner* — Sun Lin

(57) ABSTRACT

A logic design system operable to configure an integrated circuit device using custom logic design data is disclosed. The disclosed logic design system includes a computer-aided design tool that may be used to determine a memory space estimate based on a custom logic design data analysis. A memory size analysis may be performed on the custom logic design data to determine the maximum amount of stack memory that is required to execute procedures in the device. The logic design system may also monitor for changing memory requirements of the custom logic design. The logic design system may configure the device with the custom logic design data based on the memory space estimate.

17 Claims, 12 Drawing Sheets

METHOD AND APPARATUS FOR AUTOMATICALLY CONFIGURING MEMORY SIZE

BACKGROUND

Memory is extensively used in the integrated circuit industry. Memory provides data storage capacity for integrated circuits (e.g., microprocessors, microcontrollers, digital signal processors, certain application specific integrated circuits, and programmable logic devices) to support functions such as configuration, calibration, monitoring, and etc.

Because integrated circuits are generally used to implement user designs having different requirements, memory requirements of integrated circuits may be configured to support the needs of different types of user designs. Generally, users tend to select a memory size larger than the actual amount of memory used for their circuit designs to ensure that the integrated circuit includes sufficient memory to perform functions of a user design. However, having an excessively large memory size may lead to inefficient memory usage and inefficient use of limited area on the integrated circuit.

SUMMARY

In accordance to the present invention, integrated circuits such as programmable logic device integrated circuits that include memory with configurable size are provided.

It is appreciated that the present invention can be implemented in numerous ways, such as a process, an apparatus, a system, a device, or a method on a computer readable medium. Several inventive embodiments of the present invention are described below.

A method for using logic design system computing equipment is provided. The method includes receiving custom logic design data for an integrated circuit having memory with a configurable size. The computing equipment may determine an appropriate memory size by estimating how much memory should be configured based on the custom logic design. The computing equipment may configure the integrated circuit with the custom logic design data and the determined memory size.

Memory size of an integrated circuit may be configured using a computer-aided design tool. The computer-aided design tool may receive custom logic design data for an integrated circuit device. The computer-aided design tool may estimate the amount of memory required to run all the processes required by the integrated circuit device through a static memory analysis. The static memory analysis may be performed by estimating how much memory will be used by integrated circuit device processes (e.g., without running the processes on the integrated circuit device). The static memory analysis may include stack usage analysis in which the design tool estimates how much stack memory is required by the processes. Once the amount of memory is estimated, a configuration file may be generated to update the memory space information in the integrated circuit device. The computer-aided design tool may monitor changing memory requirements of the circuit.

Further features of the invention, its nature and various advantages, will be more apparent from the accompanying drawings and the following detailed description of the preferred embodiments.

DETAILED DESCRIPTION

It will be recognized, however, by one skilled in the art, that the present exemplary embodiments may be practiced without some or all of these specific details. In other instances, well-known operations have not been described in detail in order not to unnecessarily obscure the present embodiments.

Figure 1:
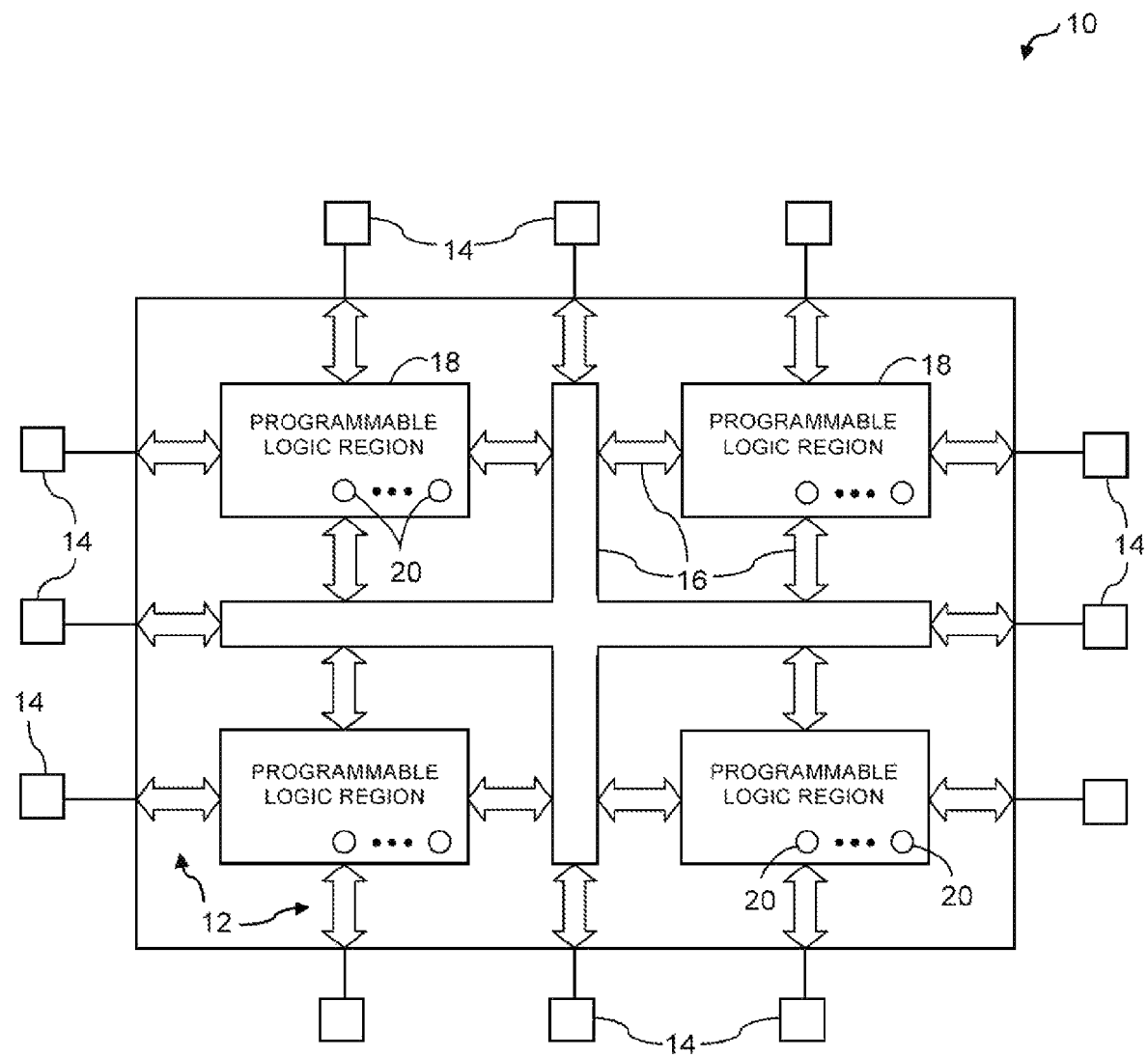
FIG. 1 is a diagram of an illustrative integrated circuit in accordance with an embodiment of the present invention.

FIG. 1 is a diagram of an illustrative integrated circuit 10 in accordance with an embodiment of the present invention. Integrated circuit 10 may have input/output circuitry 12 for driving signals off of integrated circuit 10 and for receiving signals from other circuits or devices via input/output pins 14. Interconnect resources 16 such as global and local vertical and horizontal conductive lines and busses may be used to route signals within integrated circuit 10. Interconnect resources 16 may include fixed interconnects (conductive lines) and programmable interconnects (e.g., programmable connections between respective fixed interconnects). Programmable logic regions 18 may include combinational and sequential logic circuitry. The programmable logic region 18 may be configured to perform various functions. The programmable interconnects associated with interconnect resources 16 may be considered to be a part of the respective programmable logic regions 18.

Programmable logic regions 18 may include memory elements 20. Memory elements 20 may include multiple transistors configured to form cross-coupled inverter circuits. For example, complementary metal-oxide-semiconductor (CMOS) integrated circuit technology may be used to form memory elements 20 as one suitable approach. In the context of programmable logic device integrated circuits, memory elements 20 may store configuration data and are therefore sometimes referred to as configuration random-access memory (CRAM) cells. Memory elements 20 may be generally arranged in an array pattern. In a programmable logic device, there may be millions of memory elements 20 (as an example). A user (e.g., a logic designer) may provide configuration data for the array of memory elements 20 during a programming operation. Once leaded with configuration data, memory elements 20 may selectively control (e.g., turn on and off) portions of the circuitry in programmable logic region 18 and thereby customize their functions as desired. When memory elements 20 are arranged in an array, horizontal and vertical conductors and associated control circuitry may be used to access the contents of memory elements 20. The control circuitry may, for example, be used to clear all or some of the memory elements. The control circuitry may also write data to memory elements 20 and may read data from memory elements 20. For example, in CRAM arrays, memory elements 20 may be loaded with configuration data. The loaded configuration data may then be read out from the memory array to confirm proper data capture before device 10 is used during normal operation in a system.

The circuitry of integrated circuit 10 may be organized using any suitable architecture. For instance, programmable logic regions 18 may be organized in a series of rows and columns of larger programmable logic regions, each of which contains multiple smaller regions. The larger regions are sometimes referred to as logic array blocks. The smaller logic regions are sometimes referred to as logic elements. A typical logic element may contain a look-up table, registers, and programmable multiplexers. If desired, programmable logic regions 18 may be arranged in more levels or layers in which multiple large regions are interconnected to form still larger portions of logic.

Figure 2:
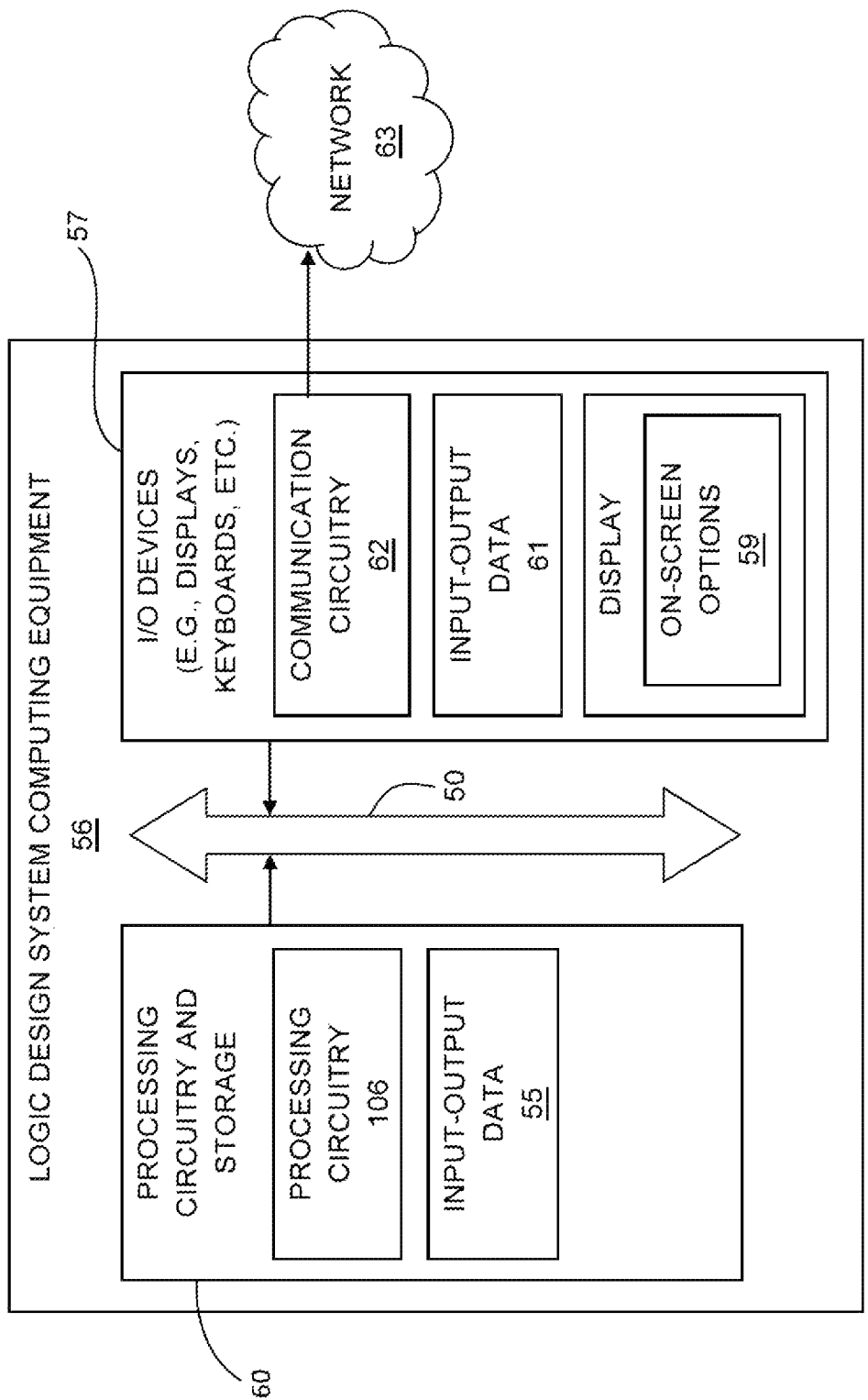
FIG. 2 is a block diagram of illustrative computing equipment in accordance with an embodiment of the present invention.

FIG. 2 is a diagram of illustrative computing equipment 56 that may be used to configure a programmable integrated circuit (e.g., using a custom logic design provided by a user). Logic design system 56 may include processing circuitry and storage 60. Processing circuitry and storage 60 may be based on one or more processors such as personal computers, workstations, etc. Processing circuitry 106 may include circuitry for performing various instructions supported in a processor or instruction set. Storage in circuitry 60 may be organized to form shared and stand-alone databases. The stored information in the storage of processing circuitry and storage 60 may include input and output data 55. For example, input data may include settings selected by a user and library data. Output data may include modeling results, configuration data, reports and any other suitable processed output from system 56. Bus circuitry 50 may provide input-output and communication between circuitries in system 56 (e.g., processing circuitry and storage 60, input-output devices 57) and external circuitries.

In supporting design operations involved in implementing a desired custom logic function on a programmable integrated circuit, logic design system 56 may use software that may automatically configures memory size to provide sufficient memory allocation in order to support programs that run on storage and processing circuitry 106. This software may take the form of one or more programs. When the programs are running on system 56, system 56 is sometimes referred to as a computer-aided design tool (or tools). Input-output (I/O) devices 57 may include input devices such as pointing devices and keyboards and may include output devices such as printers and displays. As shown in FIG. 2, system 56 may display on-screen options 59 on a display. The user may click on these on-screen options (e.g., using a pointing device or other I/O device) or may otherwise make selections based on the displayed information. The user may also provide input by typing into text boxes, by performing drag and drop operations, using tabs, etc. Input-output data 61 may be displayed on a display or printed for a user. Input-output data 61 may include input data (e.g., user input data such as data that a user has typed into a text-box or has selected using a drop-down menu or other selectable option) and output data (e.g., modeling results, reports, information indicative of design choices, etc.).

Communication circuitry 62 may facilitate data and information exchange between various circuits of system 56. Communication circuitry 62 may be used for communications with an external network such as network 63. As an example, communication circuitry 62 may provide various protocol functionality (e.g., Transmission Control Protocol/Internet Protocol (TCP/IP) (including the physical layer, or PHY), User Datagram Protocol (UDP), etc.), for communicating with network 63. Network 63 may be an Ethernet-based network, token ring-based network, or any desired external network.

Figure 3:
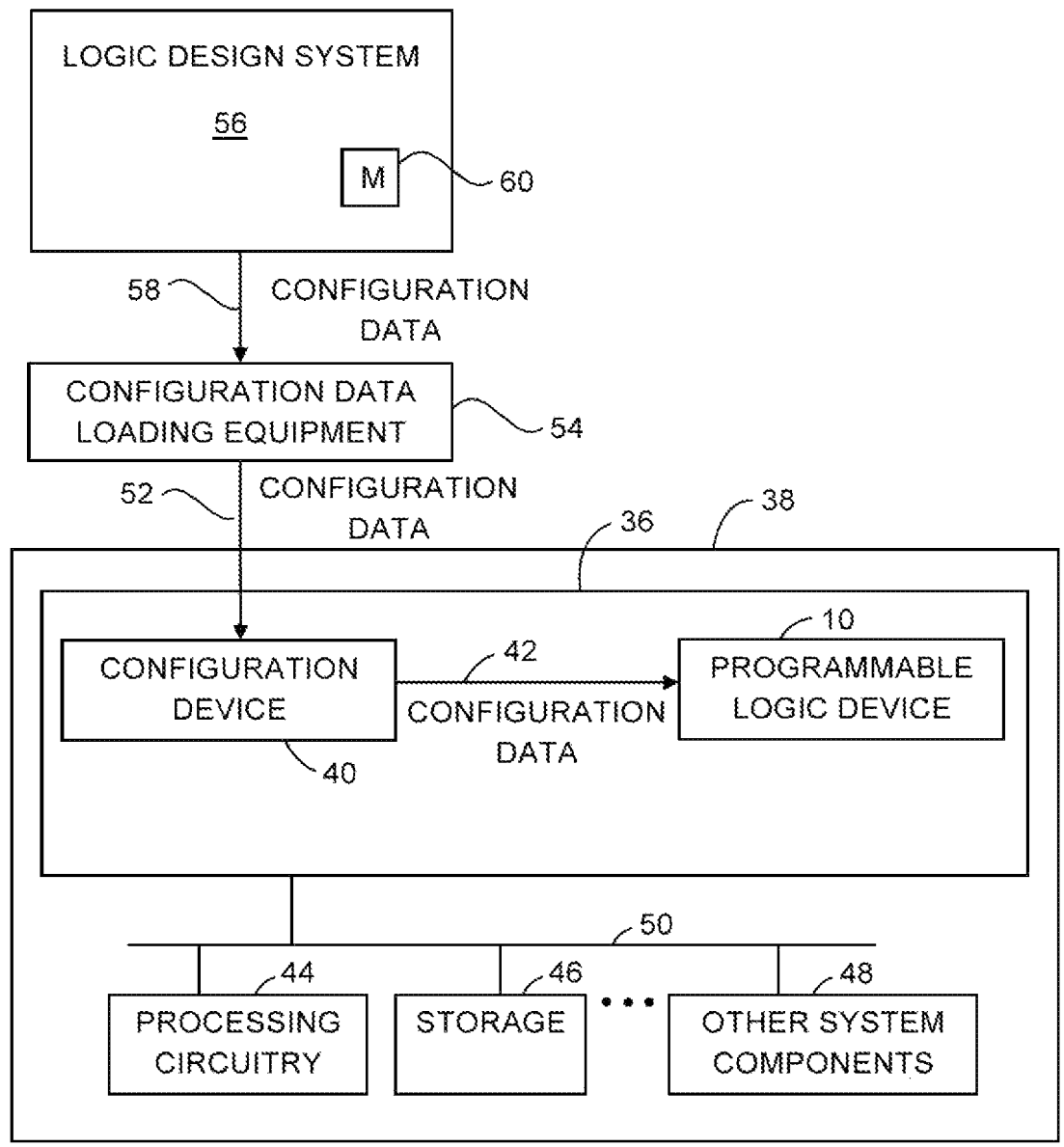
FIG. 3 is a diagram of an illustrative system environment in which a programmable integrated circuit is configured using a logic design system in accordance with an embodiment of the present invention.

FIG. 3 is a diagram of an illustrative system environment in which a programmable integrated circuit is configured using a logic design system in accordance with an embodiment of the present invention. It should be appreciated that for the sake of brevity, components already shown (e.g., integrated circuit 10 of FIG. 1, and system 56 and processing circuitry and storage 60 of FIG. 2) and described above will not be repeated. Integrated circuit 10 may be mounted on circuit board 36 in system 38. Integrated circuit 10 may receive configuration data from programming equipment or from any other suitable equipment or device.

In the example of FIG. 3, integrated circuit 10 is a type of programmable integrated circuit that receives configuration data from an associated integrated circuit such as configuration device 40. With this type of arrangement, configuration device 40 may, if desired, be mounted on the same circuit board 36 as integrated circuit 10. Configuration device 40 may be a programmable logic device configuration data loading chip that loads configuration data into programmable logic device memory from an external electrically erasable-programmable read-only memory (EEPROM) chip, a programmable logic device configuration data loading chip with built-in memory (sometimes referred to as a configuration device), or any other suitable device. When system 38 boots up (or at another suitable time), the configuration data may be supplied to integrated circuit 10 from configuration device 40, as shown schematically by path 42. The configuration data that is supplied to integrated circuit 10 may be stored in programmable memory elements (e.g., memory elements 20 of FIG. 1) that may be included in integrated circuit 10.

System 38 may include processing circuitry 44, storage 46, and other system components 48 that communicate with integrated circuit 10. The components of system 38 may be mounted on circuit board 36 or other suitable mounting structures or housings and may be interconnected by busses and other electrical paths 50.

Configuration device 40 may be supplied with the configuration data for integrated circuit 10 over a path such as path 52. Configuration device 40 may, for example, receive the configuration data from configuration data loading equipment 54 or other suitable equipment. Configuration device 40 may be loaded with data before or after installation on circuit board 36.

It can be a significant undertaking to design and implement a desired logic circuit in a programmable logic device. Logic designers therefore generally use logic design systems based on computer-aided-design (CAD) tools to assist them in designing circuits. A logic design system (sometimes referred to as a circuit design system) can help a logic designer design and test complex circuits for a system. When a design is complete, the logic design system may be used to generate configuration data for electrically programming the appropriate programmable logic device. The logic design system may be implemented on computing equipment.

As shown in FIG. 3, the configuration data produced by a logic design system 56 may be provided to equipment 54 over a path such as path 58. Equipment 54 provides the configuration data to device 40 so that device 40 can later provide this configuration data to device 10 over path 42. System 56 may be based on one or more computers and one or more software programs.

During operation of logic design system computing equipment 56, executable software such as the software of the computer-aided design tools runs on the processor(s) of system 56. Databases and other storage may be used to store data for the operation of system 56. In general, software and data may be stored on any computer-readable medium (storage) in system 56 such as storage 60. Such storage, which is shown schematically as storage 60 of FIG. 2, may include computer memory chips, removable and fixed media such as hard disk drives, flash memory, compact discs (CDs), digital versatile discs (DVDs), other optical media, and floppy diskettes, tapes, or any other suitable memory or storage device(s). When the software of system 56 is installed, the storage 60 of system 56 has instructions and data that cause the computing equipment in system 56 to execute various methods (processes). When performing these processes, the computing equipment is configured to implement the functions of the circuit design system.

Figure 4:
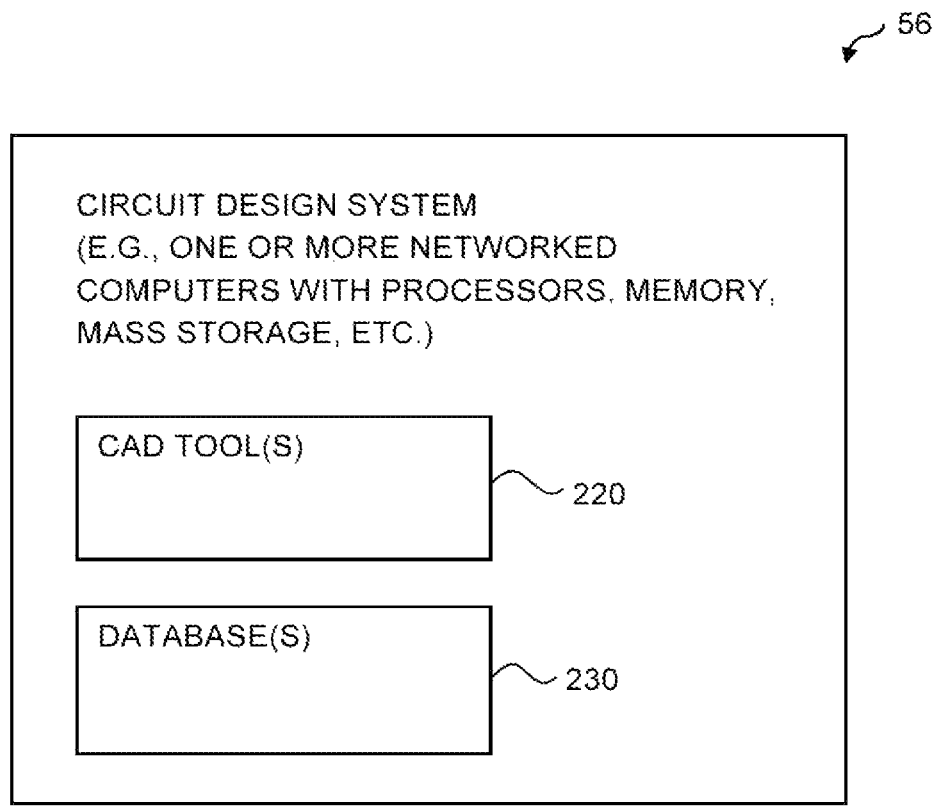
FIG. 4 is a diagram of a logic design system that may generate configuration data to implement custom circuit designs in a programmable logic device in accordance with one embodiment of the present invention.

FIG. 4 is a diagram of a logic design system for generating configuration data to implement custom circuit designs in a programmable logic device in accordance with one embodiment of the present invention. System 56 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 220 and databases 230 reside on system 56. During operation, executable software such as the software of computer aided design tools 220 runs on the processor(s) of system 56. Databases 230 are used to store data for the operation of system 56.

The computer aided design (CAD) tools 220, some or all of which are sometimes referred to collectively as a CRD tool, may be provided by a single vendor or multiple vendors. Tools 220 may be provided as one or more suites of tools (e.g., a compiler suite for performing tasks associated with implementing a circuit design in a programmable logic device) and/or as one or more separate software components (tools). Database(s) 230 may include one or more databases that are accessed only by a particular tool or tools and may include one or more shared databases.

Shared databases may be accessed by multiple tools. For example, a first tool may store data for a second tool in a shared database. The second tool can access the shared database to retrieve the data stored by the first tool. This allows one tool to pass information to another tool. Tools may also pass information between each other without storing information in a shared database if desired.

When a logic designer uses tools 220 to implement a circuit, the logic designer is faced with a number of potentially challenging design decisions. The designer must balance factors such as cost, size, and performance to create a workable end product. Tradeoffs are involved. For example, the programmable integrated circuit may include memory having a configurable size. In this scenario, it may be challenging for the logic designer to configure the memory size appropriately for a given custom logic design. If the memory size is configured to be excessively large, integrated circuit area may be configured for memory that is unused (e.g., leading to inefficient use of limited integrated circuit area). If the configured memory size is insufficient, circuitry of the custom logic design may fail to perform desired logic functions.

In accordance with an embodiment of the present invention, a logic design system such as system 56 may be configured to automatically adjust the memory size of a programmable logic device by analyzing the changing memory requirements of functions that may be performed by the device. A logic designer may use tools 220 to estimate how much memory should be configured for a given custom logic design. For clarity, the memory size estimation functions of the invention are generally described in the context of logic design system 56 and CAD tools 220. In general, any suitable number of software components (e.g., one or more tools) may be used to provide a circuit designer with memory size estimation assistance. These software components may be separate from logic compilers, place-and-route tools and other software in tools 220 or some or all of the software components that provide memory size estimation assistance functionality may be provided within logic synthesis and optimization tools, a place-and-route tool, etc.

Figure 5:
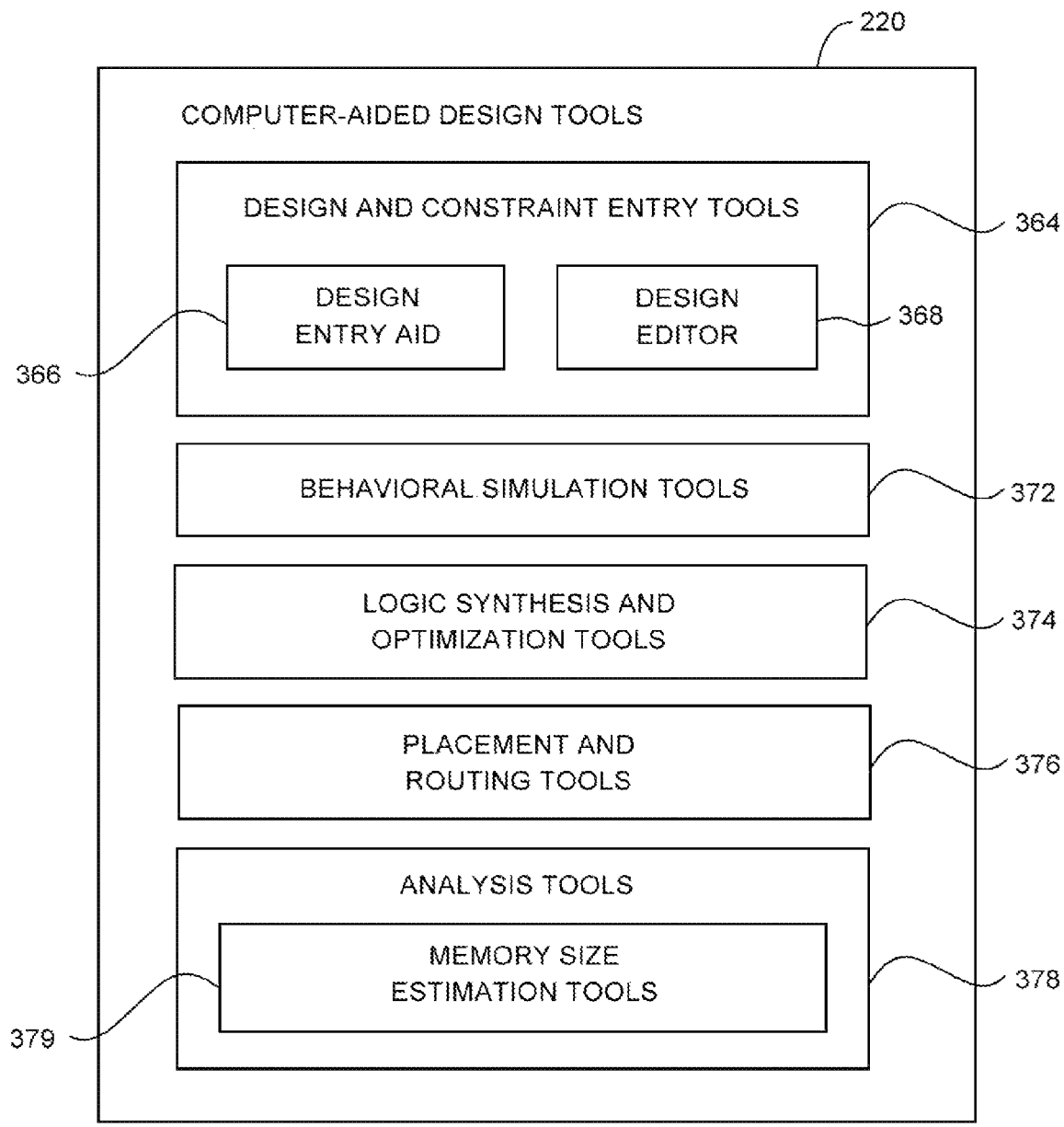
FIG. 5 is a detailed representation of illustrative computer-aided design (CAD) tools used in a logic design system accordance with one embodiment of the present invention.

A more detailed representation of illustrative computer-aided design (CAD) tools 220 that may be used in a logic design system such as system 56 of FIGS. 3 and 4 in accordance with one embodiment of the present invention are shown in FIG. 5.

The design process typically starts with the formulation of logic circuit functional specifications. A logic designer can specify how a desired circuit should function using design and constraint entry tools 364. Design and constraint entry tools 364 may include tools such as design and constraint entry aid 366 and design editor 368. Design and constraint entry aids such as design entry aid 366 may be used to help a logic designer locate a desired design from a library of existing logic designs and may provide computer-aided assistance to the logic designer for entering (specifying) the desired design. As an example, design entry aid 366 may be used to present screens of options to a user. The user may select any of the options to specify whether the circuit being designed should have certain features. As an example, design entry aid 366 may be used to provide a user with an on-screen opportunity (e.g., using a display in I/O devices 57 of FIG. 2) to enable or disable automatic memory sizing.

Design editor 368 may be used to enter a design (e.g., by entering hardware description language code or software code), edit a design obtained from a library (e.g., using a design and constraint entry aid), or assist the user in selecting and editing appropriate prepackaged code/designs. In one example, the logic design may comprise a combination of hardware and software code.

If desired, design and constraint entry tools 364 may allow the logic designer to provide a logic design to the logic design system 56 of FIG. 2 using a hardware description language (e.g., Verilog hardware description language (HDL) or Very High Speed Integrated Circuit Hardware Description Language (VHDL)) or software code (e.g., any supported programming language). The designer of the logic circuit can enter the logic design by writing hardware description language code or software code with editor 368. Blocks of code may be imported from user-maintained or commercial libraries if desired.

After the design has been entered using design and constraint entry tools 364, behavioral simulation tools 372 may be used to simulate the functional performance of the design. If the functional performance of the design is incomplete or incorrect, the logic designer can make changes to the design using design and constraint entry tools 364. The functional operation of the new design can be verified using behavioral simulation tools 372 before synthesis operations have been performed using tools 374. Simulation tools such as tools 372 may also be used at other stages in the design flow if desired (e.g., after logic synthesis). The output of the behavioral simulation tools 372 may be provided to the logic designer in any suitable format (e.g., truth tables, timing diagrams, etc.).

Once the functional operation of the logic design has been determined to be satisfactory, logic synthesis and optimization tools 374 may be used to implement the logic design in a particular programmable logic device (i.e., in the logic and interconnect resources of a particular programmable logic device product or product family).

Tools 374 may attempt to optimize the design by making appropriate selections of hardware to implement different logic functions in the logic design based on the logic design data and constraint data entered by the logic designer using tools 364.

After logic synthesis and optimization using tools 374, the logic design system may use tools such as placement and routing tools 376 to perform physical design steps (layout synthesis operations). Placement and routing tools 376 are used to determine how to place the circuits for each logic function within the programmable logic device. For example, if two counters interact with each other, the placement and routing tools 376 may locate these counters in adjacent logic regions on the programmable logic device to reduce interconnect delays or to satisfy timing requirements specifying the maximum permitted interconnect delay. The placement and routing tools 376 create orderly and efficient implementations of logic designs for a given programmable logic device.

Tools such as tools 374 and 376 may be part of a compiler suite (e.g., art of a suite of compiler tools provided by a programmable logic device vendor). In accordance with the present invention, tools such as tools 374, 376, and 378 may be configured to automatically take into account memory size requirements of a desired circuit design while implementing the circuit design. This allows tools 374 and 376 to satisfy performance requirements (e.g., memory requirements) when generating configuration data for programming integrated circuits such as integrated circuit 10 of FIG. 1.

After an implementation of the desired logic design in the programmable logic device has been generated using placement and routing tools 376, the implementation of the design may be analyzed and tested using analysis tools 378. In accordance with one embodiment of the present invention, analysis tools 378 may include memory size estimation tools 379. Tools 379 may be used to configure the memory size of the logic design. In another embodiment, tools 379 may monitor a memory stack to capture the changing stack size of the memory stack.

After satisfactory optimization operations have been completed using tools 220, tools 220 can produce the configuration data for the programmable logic device.

After satisfactory optimization operations have been completed using tools 220, tools 220 can produce the configuration data for the programmable logic device.

Figure 6:
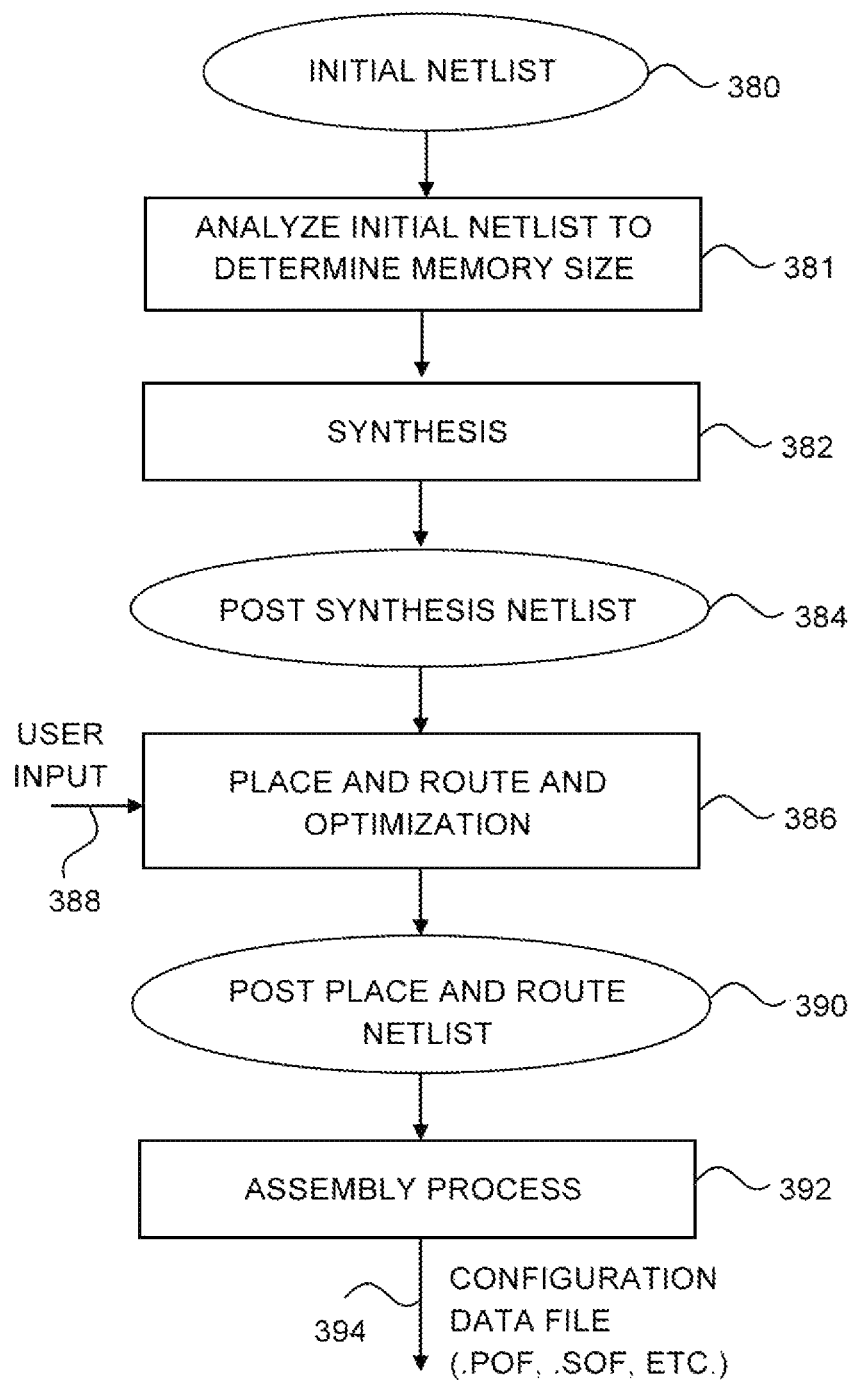
FIG. 6 is a flowchart of illustrative steps involved in producing configuration data files using computer-aided design tools and custom logic design data in accordance with an embodiment of the present invention.

Illustrative operations involved in using tools 220 of FIG. 5 to produce configuration data files are shown in FIG. 6 as one embodiment in accordance with the present invention. As shown in FIG. 6, an initial netlist 380 (e.g., custom logic design data) is analyzed to determine memory size at step 381. Consequently, netlist 380 is synthesized at step 382 to produce a post-synthesis netlist 384. At step 386, user input 388 and the post synthesis netlist 384 are processed during place and route and optimization operations 386.

In one embodiment, memory size may vary with changes to the custom logic design data. CAD tools 220 may optimize the configuration of the estimated memory requirement of the changed custom logic design data by monitoring the changing memory requirement for the integrated circuit device during the operations of step 386. The resulting post place and route netlist 390 is processed further during an assembly process 392 to produce a configuration data file output 394 (e.g., a .pof or .sof file). The configuration data file output 394 may comprise final estimated memory size information.

Figure 7:
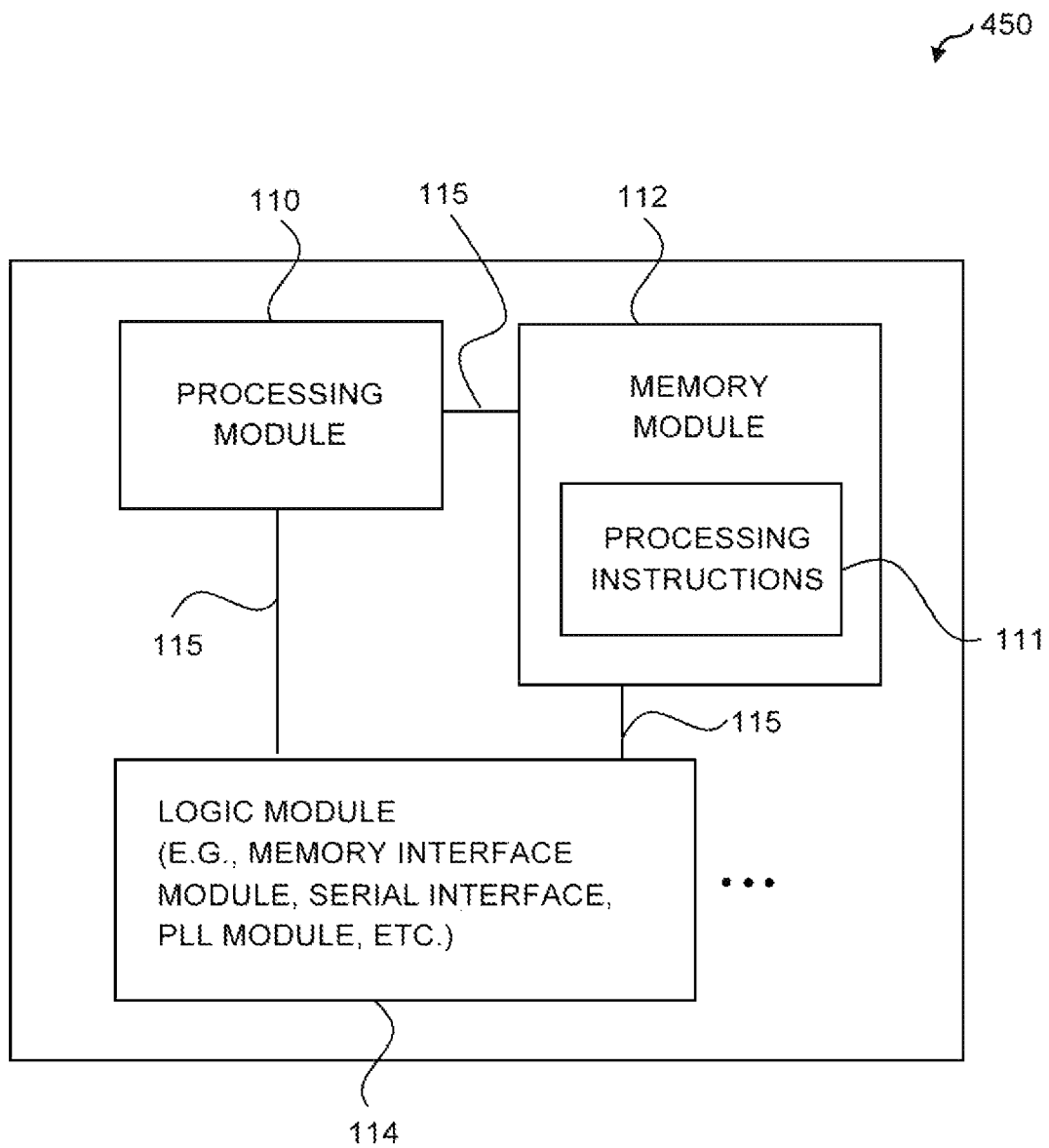
FIG. 7 is a diagram of an illustrative processing system on a programmable integrated circuit in accordance with an embodiment of the present invention.

FIG. 7 is a diagram of an illustrative processing system 450 (e.g., a user-provided custom logic design) implemented on integrated circuit 10 of FIGS. 1 and 2 in accordance with an embodiment of the present invention. The processing system may include processing module 110, memory module 112 and logic module 114. Processing module 110 may be coupled to memory module 112. Processing module 110 may retrieve and process instructions 111 from memory module 112. Through path 115, processing module 110 may send and retrieve information from logic module 114 and other system components. In one example, path 115 may be a bus. Processing module 110 may be used to monitor or control logic module 114 (e.g., memory interface module, serial interface, phase-locked loop (PLL) module, etc.).

Figure 8:
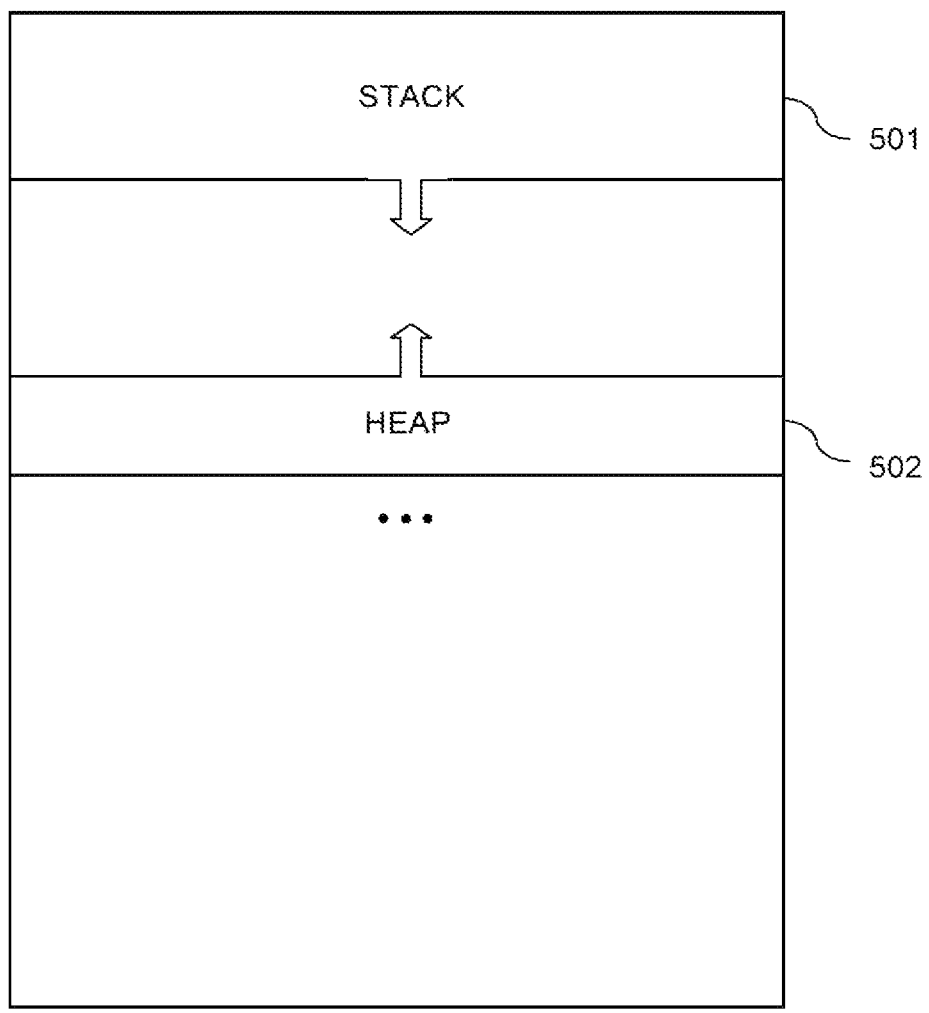
FIG. 8 is a diagram of an illustrative memory layout in a memory in accordance with an embodiment of the present invention.

FIG. 8 is a diagram of an illustrative memory layout in a memory in accordance with an embodiment of the present invention. In general, a memory layout may include stack 501, heap 502, and other memory regions such as data, instructions, vector table, etc. Stack 501 is a section of memory allocated to hold parameters and local variables associated with any function calls performed by currently running integrated circuit device. On the other hand, global dynamic data such as heap 502 is an area of memory used for dynamic memory allocation. Blocks of memory are allocated and freed in heap 502 in an arbitrary order. The pattern of allocation and size of blocks may not be known until run time (e.g., during normal operation of the device). It should be appreciated that heap 502 is usually used by a program for many different purposes.

The size of stack 501 may be determined during initial compilation of a custom user design of an integrated circuit device to ensure that enough memory is allocated for required function calls to run in the integrated circuit device. However, if the size of either heap 502 or stack 501 is not adjusted correctly, heap 502 and stack 501 may collide. As an example, the storing of data value into the top of stack 501 may increase the stack size by growing downwards until the end of heap 502. Accordingly, heap 502 may grow upwards into stack 501. It should be appreciated that stack 501 may grow downwards and stack 502 may grow upwards, depending on the architecture used on the integrated circuit device.

If the declared stack size is smaller than the amount of memory required by all the function calls, stack 501 may collide with heap 502, which may adversely affect the functionality of the integrated circuit device (e.g. insufficient resources to perform certain function calls) in the integrated circuit device. It is therefore generally desirable to configure memory module 112 with sufficient size (e.g., so that stack 501 does not collide with heap 502).

Figure 9:
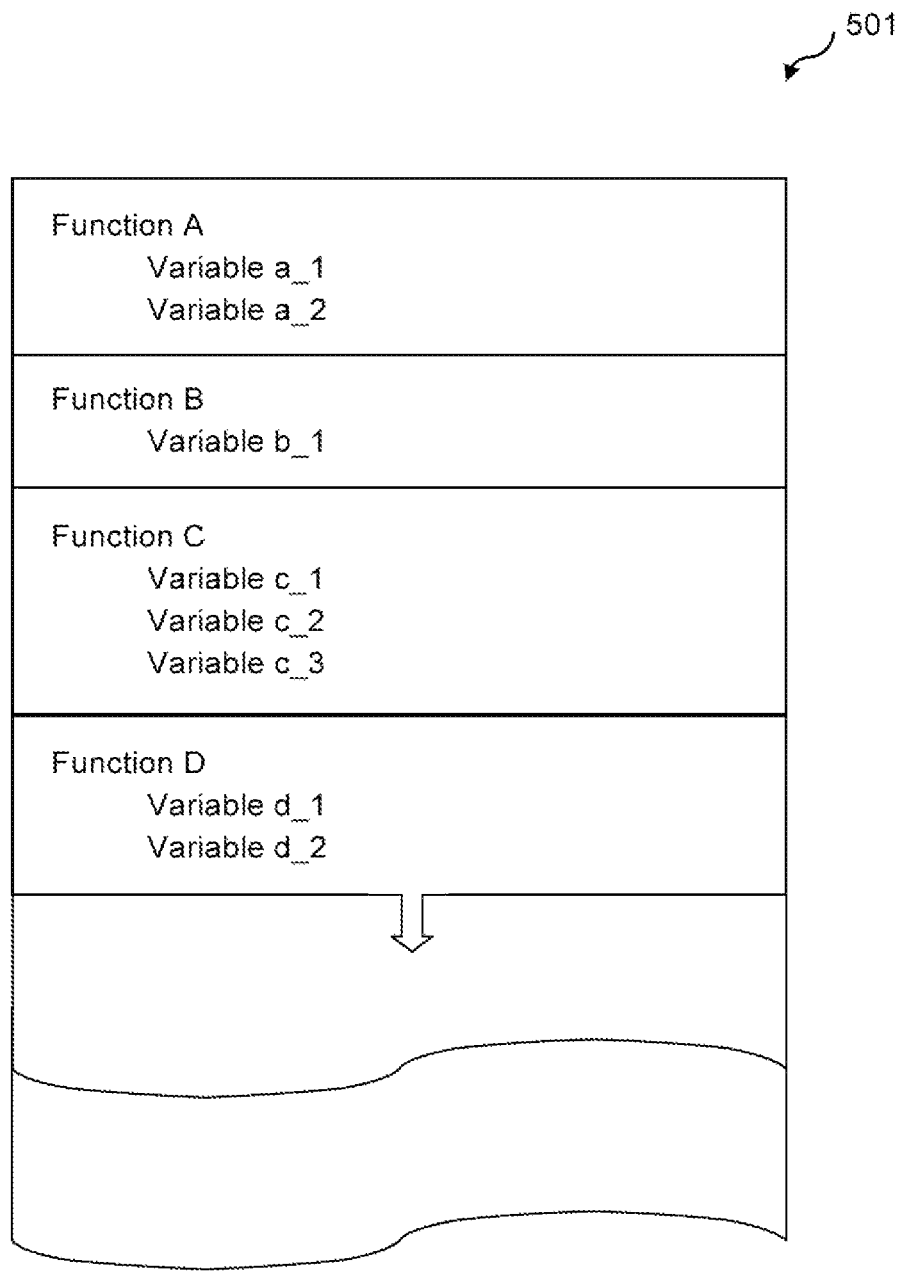
FIG. 9 is a diagram of an illustrative stack layout of a stack in a memory storing local variables of local function calls in accordance with an embodiment of the present invention.

FIG. 9 is a diagram of an illustrative stack layout of stack 501 of FIG. 8 in a memory storing local variables of local function calls in accordance with an embodiment of the present invention. The stack layout may include multiple functional blocks. Each functional block may include local variables that are stored by processing module 110 during normal operation (e.g., while processing instructions 110). For example, stack 501 has four functional blocks: functional block A storing variable a_1 and variable a_2, functional block B storing variable b_1, functional block C storing variable c_1, variable c_2, and variable c_3, functional block D storing variable d_1 and variable d_1, and so on.

In general, the size of the stack for each functional block invocation is determined by the number of variables declared in the stack, including overheads for register spilling, return addresses, etc. For example, stack may grow downwards as the stack increases in size whenever a new functional block is added to the stack (e.g., as additional variables are instantiated). It should be appreciated that even though four function blocks (e.g., functional blocks A-D) are shown in the embodiment of FIG. 9, depending on the required functionality and processes of the integrated circuit device, fewer or more functional blocks may be added to the stack.

Figure 10:
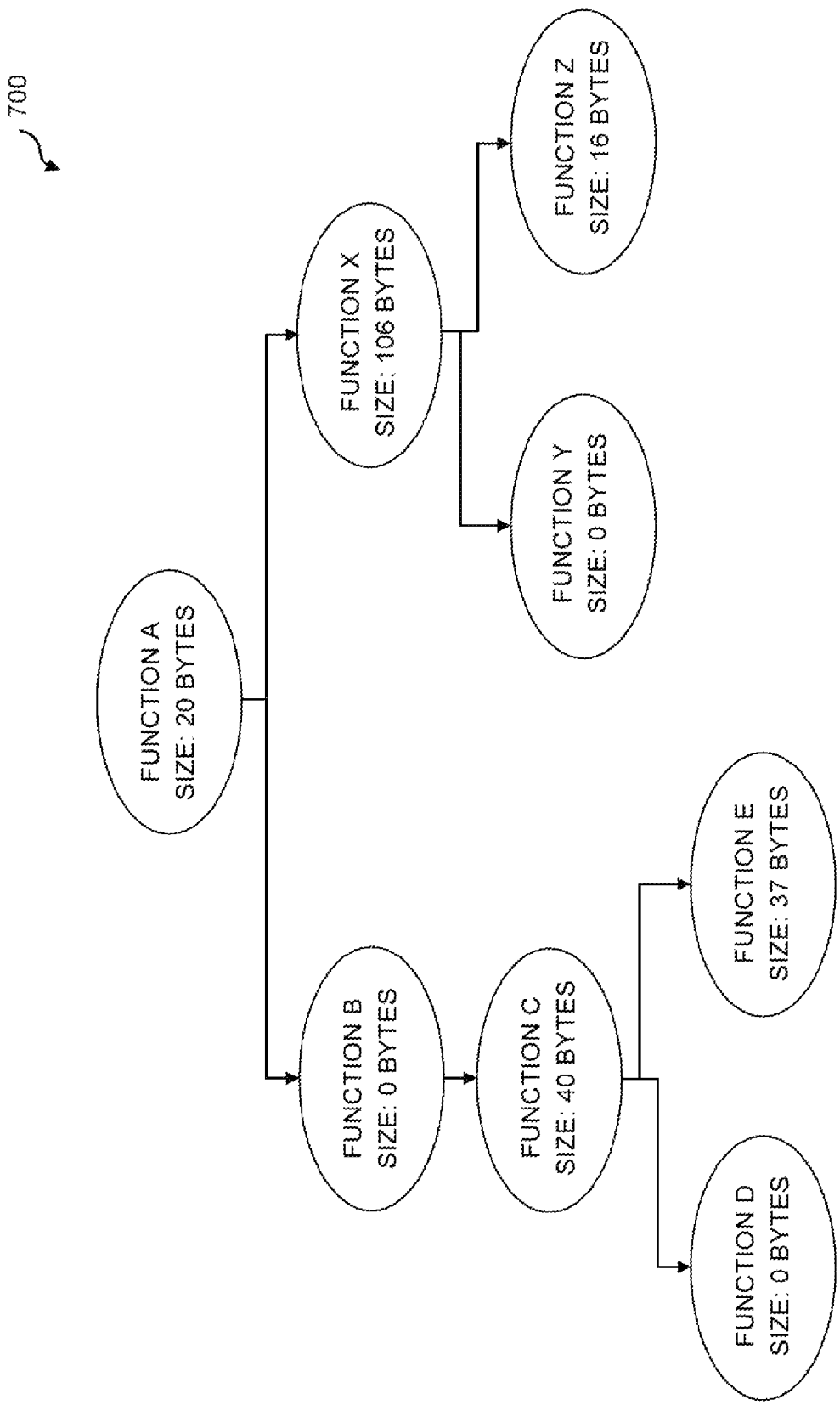
FIG. 10 is an illustrative structure of a static call graph that may be determined from custom logic design data for a static memory analysis in accordance with an embodiment of the present invention.

An illustrative structure of a static call graph for a static memory analysis is shown in FIG. 10. Static call graph 700 is a representation of every possible run in a program of a processor (e.g., processor module 110 of FIG. 7). Each run comprises a sequence of function invocations that may be referred to as function call chains. In one embodiment, the static memory analysis may be performed by memory size estimation tools 379 of FIG. 5.

The static memory analysis may analyze the maximum amount of memory required to run the system using call graph 700. For example, call graph 700 may be statically computed by identifying a function call chain through the program that produces a worst-case stack depth. The worst-case stack depth may represent the maximum amount of memory resources used by the program for static function calls (e.g., how much memory is required to implement stack 501).

As an example, a static usage analysis may identify four function call chains from call graph 700 as follows:
  i) Function A→Function B→Function C→Function D, with a total stack size of 60 bytes (20 bytes+0 bytes+40 bytes+0 bytes).
  ii) Function A→Function B→Function C→Function E, with a total stack size of 97 bytes (20 bytes+0 bytes+40 bytes+37 bytes).
  iii) Function A→Function X→Function Y, with a total stack size of 126 bytes (20 bytes+106 bytes+0 bytes).
  iv) Function A→Function X→Function Z, with a total stack size of 142 bytes (20 bytes+106 bytes+16 bytes).

Based on the example above, the fourth call chain that connects function A, function X and function Z produces the worst-case stack depth of 142 bytes. Accordingly, the maximum stack size required in the stack (e.g., stack 501 of FIGS. 8 and 9) is 142 bytes.

The information of the estimated maximum stack size may be used to allocate sufficient memory for stack 501 of FIG. 8 using tools 220 of FIG. 5. When a sufficient memory size is allocated to accommodate a maximum size of stack 501, a heap-stack collision may be avoided. In the example of FIG. 8, a sufficient stack size allocation for stack 501 may prevent stack 501 to grow into heap 502.

The heap-stack collision may also requires a boundary on the size of heap 502. In one embodiment, static usage analysis may verify whether the calls for dynamic memory allocations on heap 502 are for statically-known memory stack sizes. As an example, the static usage analysis may include analyzing the code (e.g., loops, recursive calls, and the pattern of allocations and de-allocations) where the memory allocation calls are made. Accordingly, the static usage analysis may provide a boundary on the maximum amount of dynamic memory that can be allocated on heap 502.

Figure 11:
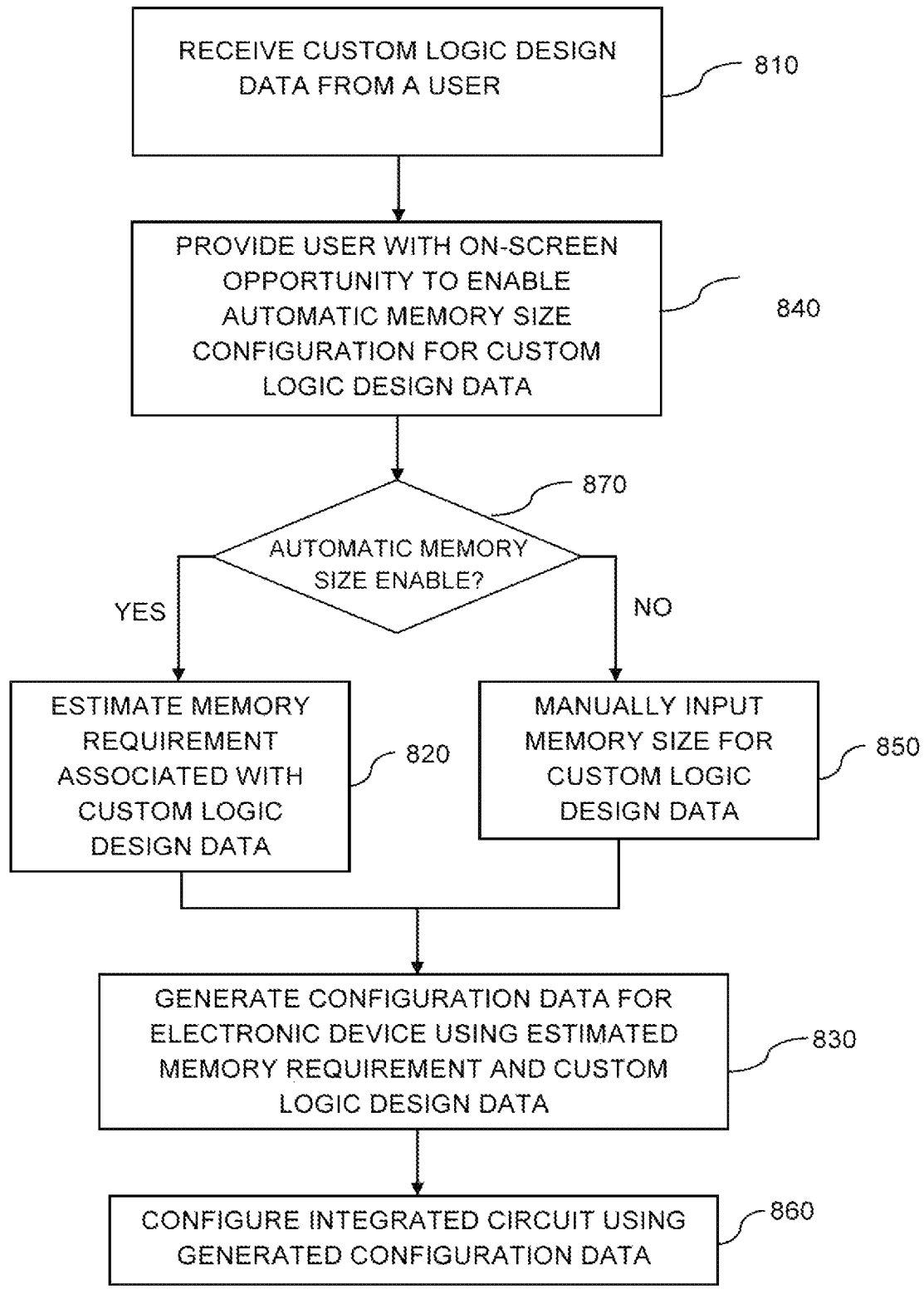
FIG. 11 is a flowchart of illustrative steps involved in using computer-aided design tools to configure an integrated circuit device using custom logic design data in accordance with an embodiment of the present invention.

A flow chart of illustrative steps involved in using computer-aided design tools 220 of FIG. 5 to configure an integrated circuit device using custom logic design data is shown in FIG. 11.

At step 810, a custom logic design data is received from a user. Tools such as design and constraint entry tools 364 of FIG. 5 may be used to receive the custom logic design data (e.g., specifications for a logic circuit or other circuits, constraint data, etc.).

At step 840, the user is provided with an on-screen opportunity to enable automatic memory size configuration for the custom logic design data. For example, computer-aided design tools 220 of FIG. 5 may implement a design input wizard that may contain a user-selectable option to enable automatic memory size configuration for custom user designs.

If automatic memory size option is enabled, an analysis operation may be performed o the custom logic design data using tool 378 at step 820. In this operation, the memory requirement of logic design system 56 is estimated based on the custom logic design data using memory size estimation tools 379. Memory requirements may also change as user enables or disables features (e.g., software processes, control registers) on the integrated circuit device. In one embodiment, changing memory requirements for the custom logic design may be identified by tools 379. On the other hand, the memory size for the custom logic design data may be manually inputted at step 850 if the automatic memory size option is disabled. As an example, computer-aided design tools 220 may provide a display for user to manually set a desired memory size for the custom logic design data.

During step 830, computer-aided design tools 220 may generate configuration data using the estimated memory requirement and custom logic design data. In one embodiment, the configuration data may be generated after the user has selected a full set of desired features for the custom logic design data.

Figure 12:
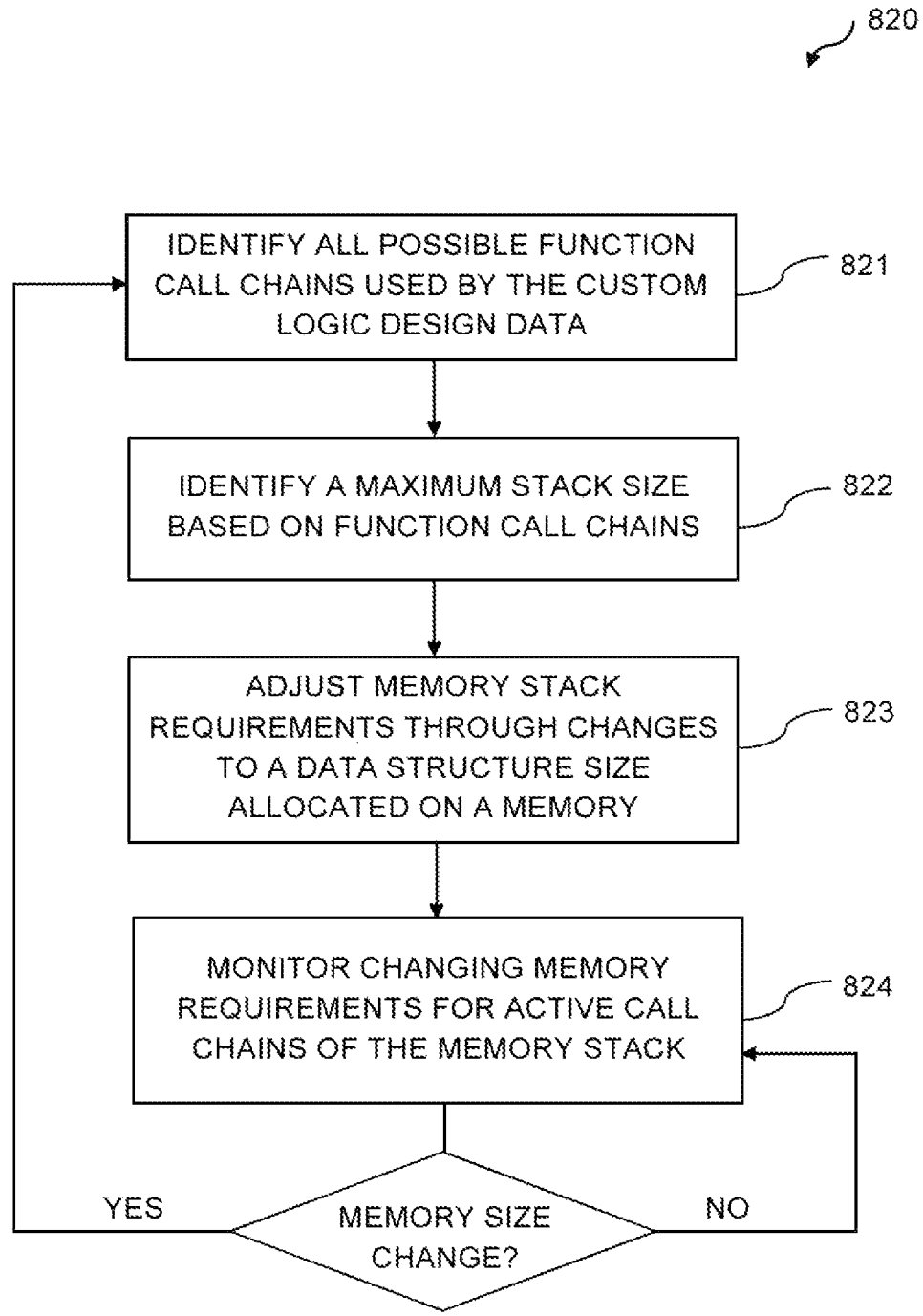
FIG. 12 is an illustrative flowchart for estimating memory requirements of a custom logic design data in accordance with an embodiment of the present invention.

At step 860, the integrated circuit device may be configured using the generated configuration data. In one embodiment, the generated configuration data may be loaded into the integrated circuit device to update or overwrite the modified memory size information. Illustrative steps involved in estimating memory requirement of a custom logic design data using tools 379 are shown in FIG. 12.

At step 821, all possible function call chains used by the custom logic design data are identified. The function call chains may include a plurality of variables stored in a stack, for example. In the exemplary embodiment of FIG. 10, function call chains may be identified by tracing the program code of the custom logic design data.

At step 822, a maximum stack size based on the function call chains is identified (e.g., estimated). As an example, call graph 10 of FIG. 10 may be used to determine the stack size based on the worst-case stack depth of the function call chains.

At step 823, memory stack requirements are adjusted through changes to a data structure size allocated on a memory. For example, the memory size information for the custom logic design data may be updated or overwritten based on the maximum stack size determined by call graph 10 of FIG. 10. Accordingly, the modified memory size information may be used to generate configuration data file 392 of FIG. 6.

At step 824, changing memory requirements for active call chains of the memory stack are monitored. When a user, for example, enables or disables a system feature, memory requirements may change. Tools 379 may monitor the memory stack to capture the changing stack size and steps 822-823 may be repeated to resize the memory stack correctly to the size of the data structure allocated on the memory.

The memory stack will be continuously monitored by tools 379 until another change in the memory requirement is detected by repeating step 823.

The method and apparatus described herein may be incorporated into any suitable circuit. For example, the method and apparatus may be incorporated into numerous types of devices such as microprocessors or other ICs. Exemplary ICs include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. A method for using logic design system computing equipment, the method comprising:
   receiving custom logic design data for an integrated circuit having a memory with a configurable size, wherein the custom logic design data includes processor design data for implementing a processor using the integrated circuit and instruction data for the processor, wherein the implemented processor is operable to process the instruction data to store data in the memory;
   with the logic design system computing equipment, estimating how much of the memory should be configured for the integrated circuit based on the custom logic design data to determine a memory size, wherein estimating how much of the memory should be configured for the integrated circuit based on the custom logic design data comprises determining how much of the data is to be stored in the memory by the processor when processing the instruction data; and
   configuring the integrated circuit with the custom logic design data and the determined memory size.

2. The method defined in claim 1 wherein the memory includes a stack portion, wherein the instruction data includes a plurality of functions that are processed by the processor, and wherein each function of the plurality of functions has corresponding function data that is stored in the stack portion by the processor when that function is processed, the method further comprising:
   with the logic design system computing equipment, identifying how much function data is stored in the stack portion by the processor when processing the instruction data.

3. The method defined in claim 2 further comprising:
   with the logic design system computing equipment, generating a static call graph from the plurality of functions of the instruction data, wherein the static call graph includes nodes corresponding to functions and links between the nodes that represent function calls.

4. The method defined in claim 3 further comprising:
   assigning a weight to each node of the static call graph that corresponds to how much function data is stored by the processor when processing the function of that node;
   identifying a plurality of paths through the static call graph; and
   for each path of the plurality of paths, summing the weights of the nodes of the static call graph that are associated with that path.

5. The method defined in claim 4 wherein the determining how much data is stored in the memory by the processor when processing the instruction data comprises:
   comparing the summed weights of each path of the plurality of paths to determine a maximum summed weight of the plurality of paths.

6. The method defined in claim 1 wherein the configuring the integrated circuit with the custom logic design data and the determined memory size further comprising:
   with an interface, providing a user with an on-screen opportunity to enable an automatic memory size configuration for the custom logic design data.

7. A method for using a computer-aided design tool to configure an integrated circuit device using custom logic design data, the method comprising:
   with the computer-aided design tool, estimating a memory requirement associated with the custom logic design data, wherein estimating the memory requirement of the custom logic design data comprises performing a static memory analysis of the custom logic design data; and
   generating configuration data for the integrated circuit device using the estimated memory requirement and the custom logic design data.

8. The method defined in claim 7 further comprising:
with the computer-aided design tool, receiving the custom logic design data from a user.

9. The method defined in claim 8 further comprising:
with the computer aided design tool, providing the user with an on-screen opportunity to enable an automatic memory size configuration for the custom logic design data.

10. The method defined in claim 7 wherein the memory comprises a memory stack.

11. The method defined in claim 7, wherein performing the static memory analysis comprises:
identifying all possible function call chains used by the custom logic design data; and
identifying a maximum stack size based on the identified possible function call chains.

12. The method defined in claim 7 further comprising:
with the computer-aided design tool, adjusting how much memory is configured for a memory stack.

13. The method defined in claim 7 further comprising:
with the computer-aided design tool, monitoring changing memory requirements for active call chains of a memory stack.

14. A logic design system operable to configure an integrated circuit device using custom logic design data, the logic design system comprising:
computing equipment that implements a computer-aided design tool that determines a memory space estimate based on the custom logic design data and configures the integrated circuit device using the custom logic design data and with the determined memory space estimate, wherein the computer-aided design tool performs a static memory analysis of the custom logic design data.

15. The logic system defined in claim 14 wherein the computing equipment implements a design input wizard in the computer-aided design tool that contains a user-selectable option to enable an automatic memory size configuration for the custom logic design data.

16. The logic system defined in 14 wherein the computer-aided design tool generates configuration data in response to the static memory analysis.

17. The logic system defined in claim 16 wherein the configuration data is loaded to the integrated circuit device.

* * * * *